US008204266B2

(12) United States Patent
Frigola Munoz et al.

(10) Patent No.: US 8,204,266 B2

(45) Date of Patent: Jun. 19, 2012

(54) AUDIO DEVICES

(75) Inventors: Jordi Frigola Munoz, Edinburgh (GB); Rene Meinhard Winter, Bergbron (SA); Piyush Gaur, Rajasthan (IN)

(73) Assignee: SFX Technologies Limited, Edinburgh (GB)

( * ) Notice: Subject to any disclaimer, the term of this patent is extended or adjusted under 35 U.S.C. 154(b) by 546 days.

(21) Appl. No.: 12/090,757

(22) PCT Filed: Oct. 23, 2006

(86) PCT No.: PCT/GB2006/003929

§ 371 (c)(1),
(2), (4) Date: Feb. 20, 2009

(87) PCT Pub. No.: WO2007/045908

PCT Pub. Date: Apr. 26, 2007

(65) Prior Publication Data

US 2009/0316943 A1 Dec. 24, 2009

(30) Foreign Application Priority Data

Oct. 21, 2005 (GB) .................................. 0521477.0
Sep. 5, 2006 (GB) .................................. 0617405.6

(51) Int. Cl.
*H04R 9/08* (2006.01)
*H04R 9/06* (2006.01)
*H05K 5/00* (2006.01)
*H04B 1/034* (2006.01)

(52) U.S. Cl. ........ 381/335; 381/337; 381/365; 181/145; 181/148; 455/128

(58) Field of Classification Search .................. 381/337, 381/332, 59, 335, 365, 189; 181/145, 148, 181/144; 455/569.1, 128, 575.1, 91
See application file for complete search history.

(56) References Cited

U.S. PATENT DOCUMENTS 4,937,877 A * 6/1990 Pocock et al. ................ 381/360
5,430,805 A * 7/1995 Stevenson et al. ............ 381/408
5,809,156 A * 9/1998 Bartels et al. ................ 381/370
6,018,584 A * 1/2000 Paulick ......................... 381/122
6,169,811 B1 * 1/2001 Croft, III ....................... 381/186
6,494,289 B1 12/2002 Bachmann et al.
7,103,193 B2 * 9/2006 Croft, III ....................... 381/345
7,346,315 B2 * 3/2008 Zurek et al. .................. 455/90.3
2002/0061114 A1 * 5/2002 Croft, III ....................... 381/345
2003/0068056 A1 * 4/2003 Aubauer et al. .............. 381/332
2004/0096077 A1 * 5/2004 Csensich et al. .............. 381/328
(Continued)

FOREIGN PATENT DOCUMENTS

DE 19821861 A1 11/1999
(Continued)

*Primary Examiner* — Anh Mai

(74) *Attorney, Agent, or Firm* — Fitzpatrick, Cella, Harper & Scinto

(57) ABSTRACT

An electronic device having an audio function and its loudspeaker arrangement are described. The electronic device comprises an exterior housing, an acoustic transducer and an acoustic radiator forming a part of the exterior housing of the electronic device. In one embodiment, the exterior housing undergoes pistonic movement and is provided with hydrogel pads to couple an acoustic signal to an auxiliary surface, which then vibrates in a distributed mode. The voice coil may be directly bonded to the exterior housing. A formation may be provided to promote pistonic movement of a part of the exterior housing. Methods of operation and formation are also described.

14 Claims, 6 Drawing Sheets

U.S. PATENT DOCUMENTS

2005/0207610 A1* 9/2005 Kajiwara et al. .............. 381/396
2006/0133627 A1* 6/2006 Lee ............................... 381/182

FOREIGN PATENT DOCUMENTS

| | | | |
|---|---|---|---|
| GB | 2397720 | A | 7/2004 |
| GB | 2411539 | A | 8/2005 |
| WO | 97/09842 | A2 | 3/1997 |
| WO | 98/52381 | A2 | 11/1998 |
| WO | 00/69212 | A | 11/2000 |
| WO | 01/72084 | A2 | 9/2001 |
| WO | 2004/100600 | | 11/2004 |
| WO | 2004/114717 | A2 | 12/2004 |

* cited by examiner

AUDIO DEVICES

FIELDS OF INVENTION

The present invention relates to the field of audio devices and components, and in particular to loudspeaker arrangements for use with and in consumer electronic devices. The invention has particular application to portable electronic devices, such as mobile telephones, laptop computers and music players.

BACKGROUND OF THE INVENTION

Amongst consumers of electronic devices, there is an increasing expectation of high sound quality from audio components, particularly as access to and playback of multimedia content from a variety of portable electronic devices becomes more prevalent. However, there is an increasing need to provide electronic equipment that fits in with lifestyles of modern consumers, for example by offering improved portability, convenience of use and style. Issues of cost, size and acoustic performance become important.

Distributed mode loudspeaker (DML) arrangements are used in a variety of applications. For example, WO 2004/114717 discloses a driver assembly for a panel loudspeaker including a hydrogel retaining element for locating the voice coil with respect to the magnet assembly and forming a surface for removable attachment of the driving assembly to a radiating member.

Other flat panel arrangements have been proposed which provide permanent fixing of a speaker driver to a radiating panel. However, presently available arrangements are limited in their flexibility of application, for example they may not be suitable for smaller electronic devices.

It is an aim and object of the invention to provide an improved distributed mode loudspeaker and components thereof.

It is an additional aim of the invention to provide an improved loudspeaker design suitable for use with consumer electronic products.

It is further aim of the invention to provide an improved housing component for a consumer electronic device.

SUMMARY OF INVENTION

Additional aims and objects of the invention will become apparent from a reading of the following description.

According to a first aspect of the invention there is provided an electronic device having an audio function, the electronic device comprising:

an exterior housing;

an acoustic transducer configured to receive an electrical audio signal and produce a first acoustic signal;

a first acoustic radiator coupled to the first acoustic transducer, the first acoustic radiator being operative to radiate an acoustic signal in dependence on the acoustic signal;

wherein the first acoustic radiator forms a part of the exterior housing of the electronic device.

Preferably, the electronic device is a consumer electronics device having a second function other than an audio function. For example, the electronics device may be any one of a mobile telephone; a display screen; a portable digital assistant (PDA); a computer docking station; an MP3 player; a CD player; a television; a computer or laptop computer. The electronics device may be portable.

Preferably, the first acoustic radiator is configured to radiate the first acoustic signal into free space in a first mode of use, and is configured to be coupled to a second acoustic radiator in a second mode of use such that the second acoustic radiator is operative to radiate an a second acoustic signal in dependence on the first acoustic signal.

In one embodiment, the first acoustic radiator is configured to undergo pistonic movement. In the first mode of operation, the part of the exterior housing undergoes pistonic movement and radiates the acoustic signal into free space by virtue of this pistonic movement.

The exterior housing may comprise a formation which functions to promote the operation of the part of the exterior housing as an acoustic radiator. The formation may promote pistonic movement of the part of the exterior housing. The formation may define a boundary of the first acoustic radiator.

The formation may comprise a discrete portion of the exterior housing providing increased mobility of the first acoustic radiator. The formation may facilitate movement of the first acoustic radiator normal to an outer surface of the exterior housing. The formation may be a portion of the exterior housing with greater flexibility than adjacent portions of the exterior housing. The formation may comprise a groove formed in a surface of the housing. The formation may partially or fully surround the first acoustic radiator.

In an alternative embodiment, the first acoustic radiator may have a section of reduced thickness compared with the thickness of the exterior housing.

Alternatively, or in addition, the first acoustic radiator is configured to vibrate in a pistonic mode at frequencies in a low frequency band and in a distributed mode in frequencies in a high frequency band. In practice, the exterior housing (or components of it) will vibrate in a distributed mode at certain frequencies. The device may be configured to promote distributed mode vibration of certain parts of the device, to improve the acoustic response of the device when operating in a first mode of use. The device may be provided with a distributed mode acoustic radiator, which advantageously is a flat panel component of the device, such as a display screen.

Preferably, the first acoustic radiator is not merely on the exterior of the device, it is a part of the exterior housing which is adapted or configured to undergo acoustic vibration. It is preferably a part of the exterior housing which separates internal function components with the exterior, and offers some structural and/or protective function. The first acoustic radiator may be unitary with an exterior housing member that forms a significant proportion of, the majority of, or substantially all of, an exterior surface of the electronic device.

The exterior housing sub-member may be a part of housing for a mobile telephone or a mobile telephone accessory.

The first acoustic radiator may be the whole of the part of an exterior housing member. The exterior housing member is preferably a part of the exterior of the electronic device which is convenient to locate on an auxiliary surface during use, such that the auxiliary surface can form the second acoustic radiator. The exterior housing member may be a part of a lower, back or bottom surface of the electronic device.

The electronics device may be a mobile telephone, and the exterior housing member may be a part of the back or rear side of a housing of the mobile telephone. In this context the back or rear side of a mobile telephone housing is the side which would be placed on a surface if the telephone was laid to rest. In a conventional mobile telephone or “slide-phone”, this side opposes the surface on which the display screen and main keypad is located. In a “flip phone” or “clam-shell” telephone the housing may be designed such that one side is preferentially placed on a surface when the telephone is laid to rest. In this case, the exterior housing member may be the designated “lower” surface. However, the exterior housing sub-member may form a component of the telephone on a side which is designed to be placed on a surface when the telephone is laid to rest. Advantageously, the telephone is laid to rest on a side of the housing which permits access to keys or visibility of the telephone display.

Preferably, the electronic device is provided with a coupling means for acoustic coupling of the first acoustic radiator to a second acoustic radiator. Preferably, the second acoustic radiator is an auxiliary surface. The auxiliary surface may be in the form of any one of: a wall surface, table, desktop, ceiling and/or a cardboard sheet, or any surface capable of being driven to radiate sound.

The second acoustic radiator preferably vibrates in a distributed mode.

The coupling means may be made from an elastomeric material. The elastomeric material may be silicone and may be a hydrogel. Preferably, the coupling means comprises at least one pad or strip. The at least one pad or strip may be formed from a material comprising silicone. The at least one pad or strip may be formed from a hydrogel.

The elastomeric material may have a Shore A hardness of less than 20. The elastomeric material may have a Shore A hardness of less than 10.

The coupling means may comprise a pad or strip bonded to the outer surface of the electronics device. The coupling means may comprise a plurality of discrete pads or strips.

Preferably the coupling means are shaped to prevent contact of the housing of the electronic device with an auxiliary surface.

In a first mode of use, the first acoustic radiator functions as a component of a loudspeaker, radiating the acoustic signal into free space. However, embodiments of the invention allow the electronic device to be coupled to a second acoustic radiator, in the form of an auxiliary surface, such that acoustic energy is transferred to the auxiliary surface. The auxiliary surface becomes a part of a distributed mode loudspeaker, radiating the acoustic signal into free space. This improves the overall acoustic performance of the device. This facilitates, for example, use of a mobile telephone in a hands-free mode, and improves the ability of a variety of electronic devices to play back audio content at high quality without the use of large internal speakers, or connection to external speakers. The present invention also provides an improved arrangement by which the acoustic response of the electronic device is not necessarily limited by the internal cavities of the electronic device or the volume and mass of components provided in the cavities. This provides more flexibility in design of the electronic device.

The acoustic transducer preferably comprises a voice coil coupled to the first acoustic radiator. The voice coil is preferably rigidly coupled to the first acoustic radiator. The voice coil may be bonded to the first acoustic radiator.

The first acoustic radiator is preferably provided with a support member to which the voice coil is coupled. The support member is preferably raised from the surface of first acoustic radiator. The support member may be a ring formed to the dimensions of the voice coil. The support member may be unitary with the first acoustic radiator.

Preferably, the loudspeaker assembly comprises a magnet assembly located with respect to the voice coil by a locating means.

Preferably, the loudspeaker assembly comprises a magnet assembly retained with respect to the voice coil by a retaining means.

Preferably, the locating means and/or retaining element are elastomeric, and may be formed from a silicone or hydrogel material.

Preferably, the locating means and retaining means are an elastomeric element.

Preferably the elastomeric element couples the magnet assembly to the first acoustic radiator.

Optionally the elastomeric element has a Shore A hardness in the range 0 to 40. Advantageously, the elastomeric element has a Shore A hardness of approximately 20.

The elastomeric element is preferably substantially tubular. The elastomeric element may provide an annular seat for the magnet assembly.

The elastomeric element has the function of retaining and locating the magnet assembly with respect to the voice coil. The voice coil is thus positioned in the magnetic flux space. Selecting an appropriate structure, material and hardness for the elastomeric element allows relative movement of the magnet assembly to the exterior housing member and voice coil.

According to a second aspect of the invention, there is provided a method of producing an acoustic signal from an electronic device, the method comprising the steps of:

a) Receiving an electrical audio signal in an acoustic transducer and producing a first acoustic signal;
b) Causing a part of an exterior housing of the electronic device to radiate an acoustic signal in response in dependence on the first acoustic signal.

Preferably, the method includes the step of coupling the electronic device to a second acoustic radiator in a such that the second acoustic radiator is operative to radiate an a second acoustic signal in dependence on the first acoustic signal.

Preferably, the method includes the step of radiating the first acoustic signal into free space in a first mode of use.

Embodiments of the second aspect of the invention may include one or more features of the first aspect of the present invention and its embodiments.

According to a third aspect of the invention there is provided a method of forming a loudspeaker arrangement for an electronic device, the method comprising the steps of:

a) Coupling a voice coil to a part of an exterior housing of the electronics device; and
b) Locating a magnet assembly in the loudspeaker arrangement to form an acoustic transducer;

wherein the part of the exterior housing is operative as an first acoustic radiator in use.

The method may comprise the steps of retaining and/or locating one or more components of the loudspeaker assembly by an elastomeric element.

The method may comprise the additional steps of providing a coupling means on the outer surface of the electronic device. The coupling means functions to allow acoustic coupling of the electronic device to a second acoustic radiator.

According to a fourth aspect of the invention, there is provided a loudspeaker arrangement or electronic device produced by the method of the third aspect of the invention.

Embodiments of the third or fourth aspects of the invention may include one or more features of the first or second aspects of the invention and its embodiments.

According to a fifth aspect of the invention, there is provided an acoustic radiator for a distributed mode loudspeaker, characterised in that the acoustic radiator is adapted to form an exterior housing member for a portable electronic device.

According to a sixth aspect of the invention there is provided a portable electronic device having a loudspeaker assembly and an exterior housing member, characterised in that the exterior housing member forms an acoustic radiator for the loudspeaker assembly.

According to a seventh aspect of the invention there is provided a mobile telephone having a loudspeaker assembly and an exterior housing member, characterised in that the exterior housing member forms an acoustic radiator for the loudspeaker assembly.

Embodiments of the fifth, sixth or seventh aspects of the invention may include one or more features of the first or second aspects of the invention and its embodiments.

DESCRIPTIONS OF DRAWINGS

There will now be described, by way of example only, embodiments of the invention with reference to the following drawings, of which:

DETAILS DESCRIPTION

Figure 1:
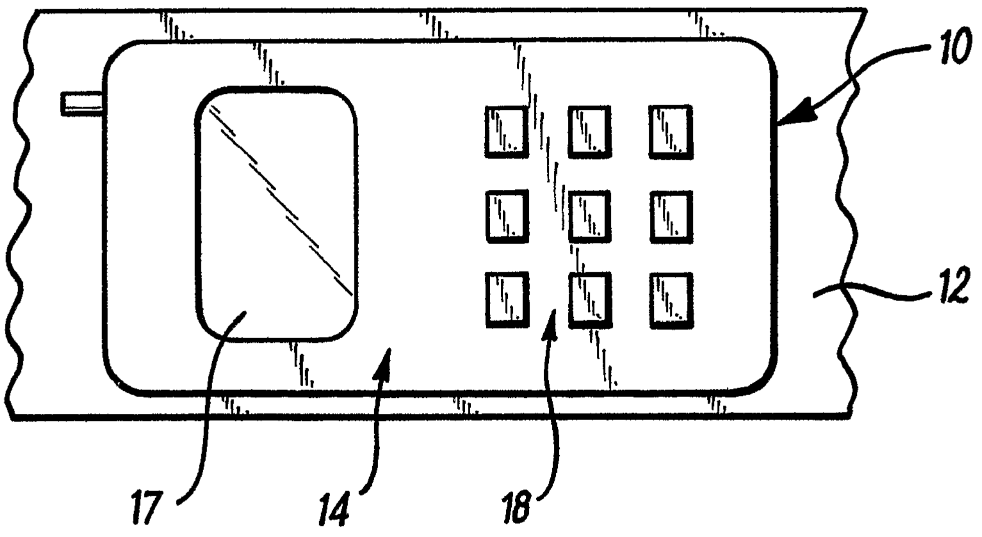
FIG. 1 is a plan view of a mobile telephone in accordance with an embodiment of the invention.
Figure 2:
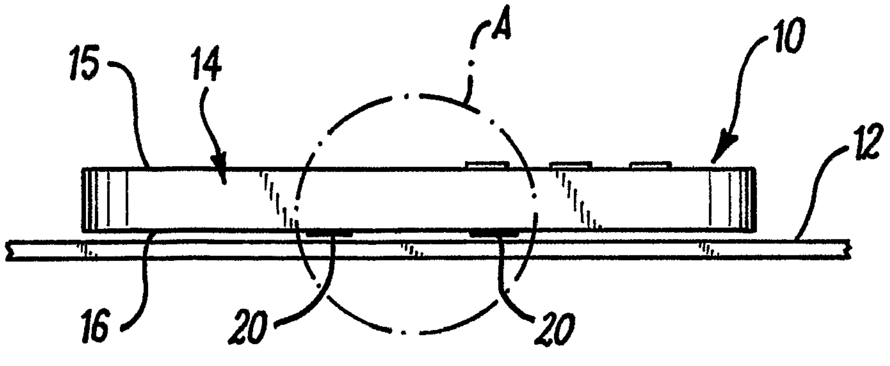
FIG. 2 is a side elevation of the mobile telephone of FIG. 1.

Referring firstly to FIGS. 1 and 2, there is shown a mobile telephone, generally depicted at 10, located on an auxiliary surface 12. The telephone 10 comprises a housing 14 having an upper surface 15 and a lower surface 16. A display 17 and a keypad 18 are provided on the upper surface 15. The lower surface 16 is provided with a coupling means in the form of pads 20. In this example, the pads 20 are two discrete strips extending across substantially the whole width of the lower surface. The pads 20 are shaped and positioned to support the telephone on the auxiliary surface 12, while preventing direct contact of the housing 14 with the auxiliary surface. In other embodiments, the pads will be formed and positioned according to the shape of the housing.

The pads 20 are bonded to the lower surface of the housing, and are formed from an elastomeric hydrogel material. In this example, the hydrogel has a Shore A hardness of less than 10.

Figure 3A:
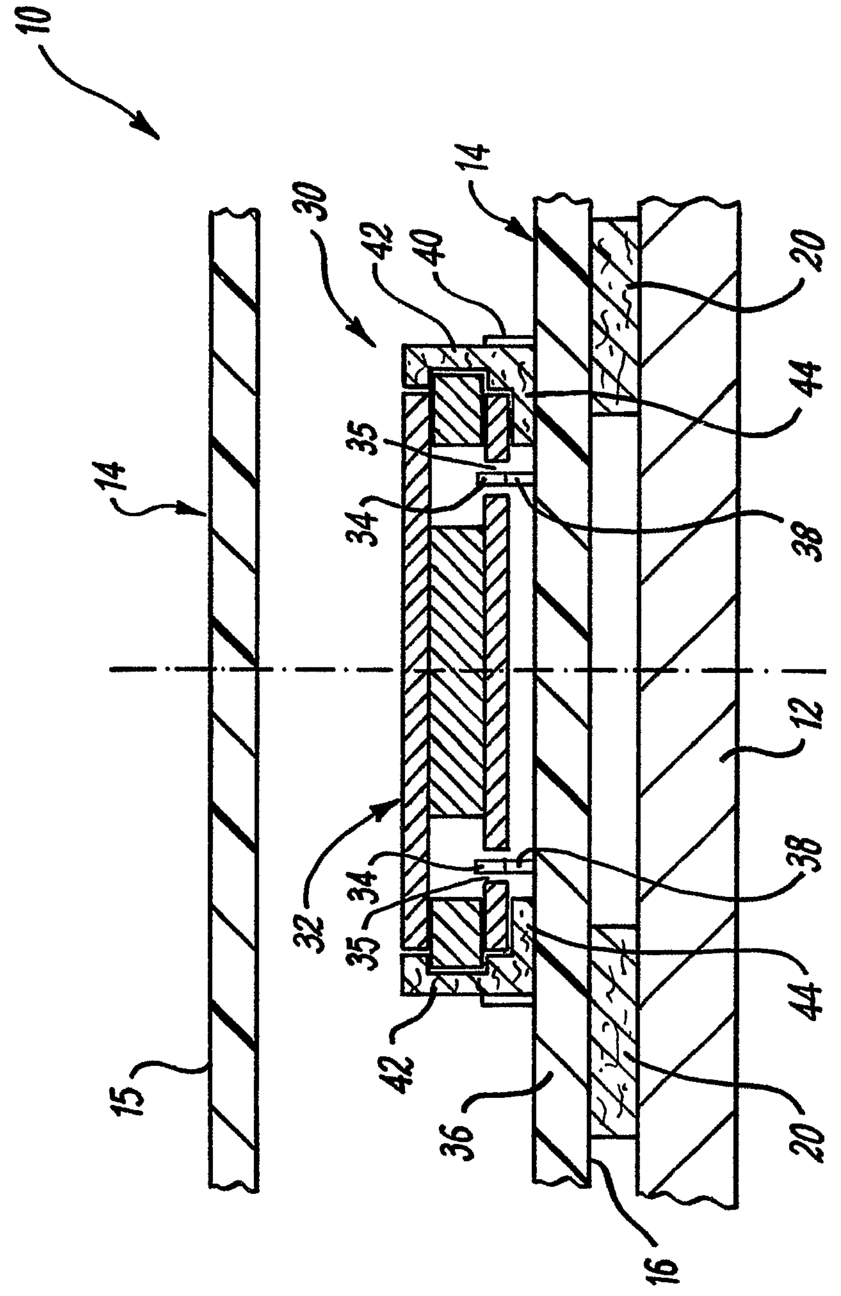
FIG. 3A is a cross-sectional view of a portion of the mobile telephone of FIG. 2, showing internal components.
Figure 3B:
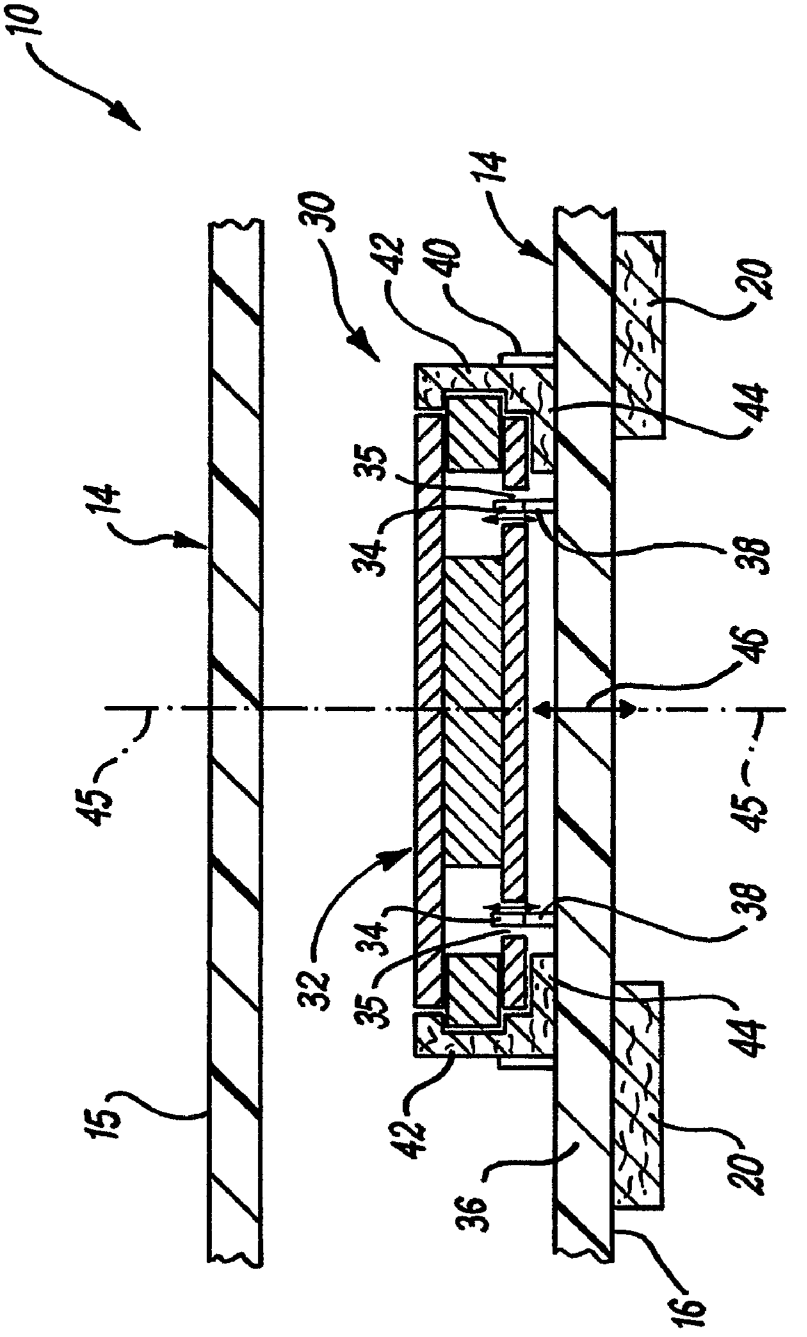
FIG. 3B is a is a cross-sectional view of a portion of the mobile telephone of FIG. 3A, showing mobility of components.

FIGS. 3A and 3B show a cross-section through internal components of the telephone 10 in the area A shown in FIG. 2.

Internal to the housing is a loudspeaker assembly, generally shown at 30. The loudspeaker assembly 30 comprises a magnet assembly 32 and a voice coil (or field coil) 34 located in an annular magnetic flux space 35 defined by the magnetic assembly 32. In this example, the magnet assembly 32 comprises an inner cylindrical magnet and outer annular magnet. An upper plate joins the inner and outer magnets and a lower plate having an annular space defines the flux space.

The voice coil 34 is a copper coil connected to current supply wires (not shown), and is bonded to an exterior housing member 36 forming part of the housing 14. The exterior housing member is provided with a raised formation or nerve 38 with the same lateral dimensions as the voice coil. The voice coil is bonded onto the raised formation 38 so that it is raised from the inner surface of the exterior housing member 36. This assists in locating the voice coil in the annular flux space. In this example, the raised formation is unitary with the exterior housing member 36, having been moulded during the manufacturing process. The voice coil 34 is rigidly coupled to the exterior housing member 36.

The exterior housing member is provided with a second raised formation 40 concentric with the formation 38, also unitary with the exterior housing member, for locating a retaining and retaining element 42. The element 42 functions to locate and/or retain the magnet assembly in a spatially separated relationship with the voice coil. The element 42 functions to locate and retain the magnet assembly in the axial and radial axes of the voice coil.

The element 42 is substantially tubular in shape, having a side wall, radially extending retaining formations, and an annular seat 44 for the magnet assembly. The element 42 is elastomeric, made of a hydrogel with a Shore A hardness of approximately 20. The element allows relative movement of the magnet assembly and the voice coil appropriate of the acoustic operation of the loudspeaker.

The exterior housing member 36 is substantially rigid, and is displaceable relative to the magnet assembly 32 together with the voice coil 34. An electric current in the voice coil produces a corresponding movement of the voice coil and exterior housing member 36 relative to the magnet assembly 32. The loudspeaker assembly 30 functions to permit "pistonic" movement of the exterior housing member 36 relative to the magnet assembly 32. This relative movement is directed substantially axially along a central axis 45 of the loudspeaker assembly 30, as indicated by arrows 46.

In FIG. 3A, the external housing member 36 is coupled to the auxiliary surface 12 via hydrogel pads 20. The hydrogel pads 20 allow the loudspeaker assembly 30 and enclosure 14 to be detached from the auxiliary surface 12. The hydrogel pads 20 also allow the exterior housing member 36 to move relative to the auxiliary surface 12 permitting transfer of an acoustic signal produced by the loudspeaker assembly via the exterior housing member to the auxiliary surface. Thus, the substantially rigid exterior housing member 36 can vibrate and move relative to the auxiliary surface, and can exert a pressure signal via the pads 20 to the auxiliary surface.

The physical properties of the hydrogel provide for an effective acoustic coupling and efficient transfer of the pressure signal to the auxiliary surface. A pressure signal generated in this manner in a localised portion of the auxiliary surface creates distributed modes in the auxiliary surface 12, and the auxiliary surface acts as a panel-form acoustic radiator of a distributed mode loudspeaker.

In FIG. 3B, the loudspeaker assembly of FIG. 3A is not coupled to any auxiliary surface, and the exterior housing member 36 moves in a pistonic fashion. In this configuration, the housing member functions in a similar manner to the speaker cone in a conventional loudspeaker.

Figure 4:
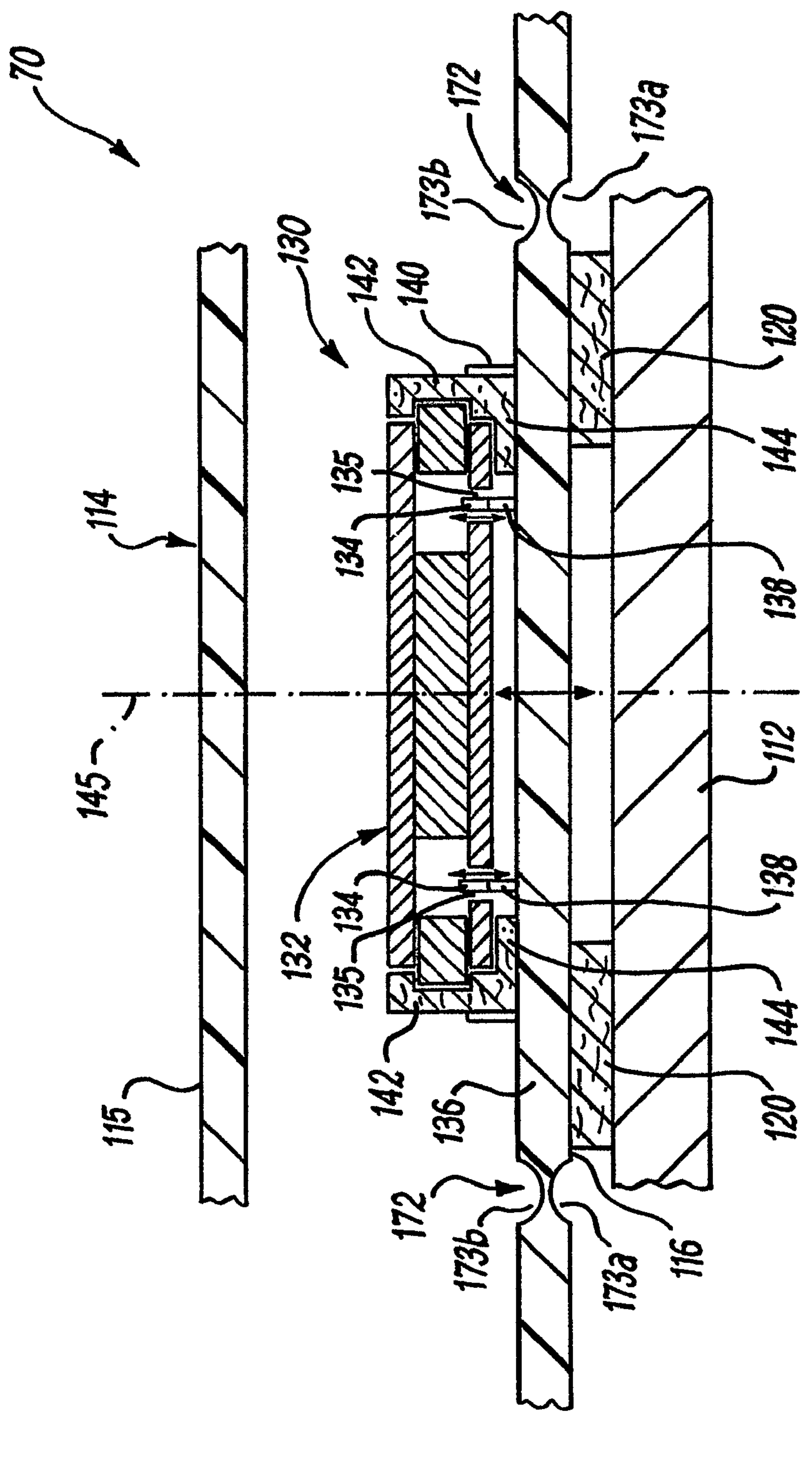
FIG. 4 is a cross-sectional view of a portion of a mobile telephone according to an alternative embodiment of the invention.

In FIG. 4, there is shown a further embodiment of a loudspeaker assembly 70, as applied to a mobile telephone housing.

In this example, the loudspeaker assembly 70 comprises a magnet assembly 132, retaining member 142, and a voice coil 134 rigidly coupled to an inner surface of the exterior housing member 136 similar to the embodiments of FIGS. 3A and 3B described above.

However, in this case, the housing 114 is provided with a formation 172 around the exterior housing member 136. The formation functions to structurally delimit the exterior housing member 136 from the remainder of the housing 114. The exterior housing member 136 remains coupled to the housing 114 through the formation. Thus, the formation provides a connecting region between the exterior housing member 136 and the housing 114.

In this example, the formation 172 comprises opposing circular grooves 173*a*, 173*b* in the lower and upper surfaces of the housing 114 respectively. At the location of the formation, the thickness of the housing is thinner than in other locations, and therefore more flexible and more easily deformable. This eases movement of the exterior housing member 136 with respect to the housing 114. Thus, the formation 172 functions to assist pistonic movement of the exterior housing member 136.

Figure 5:
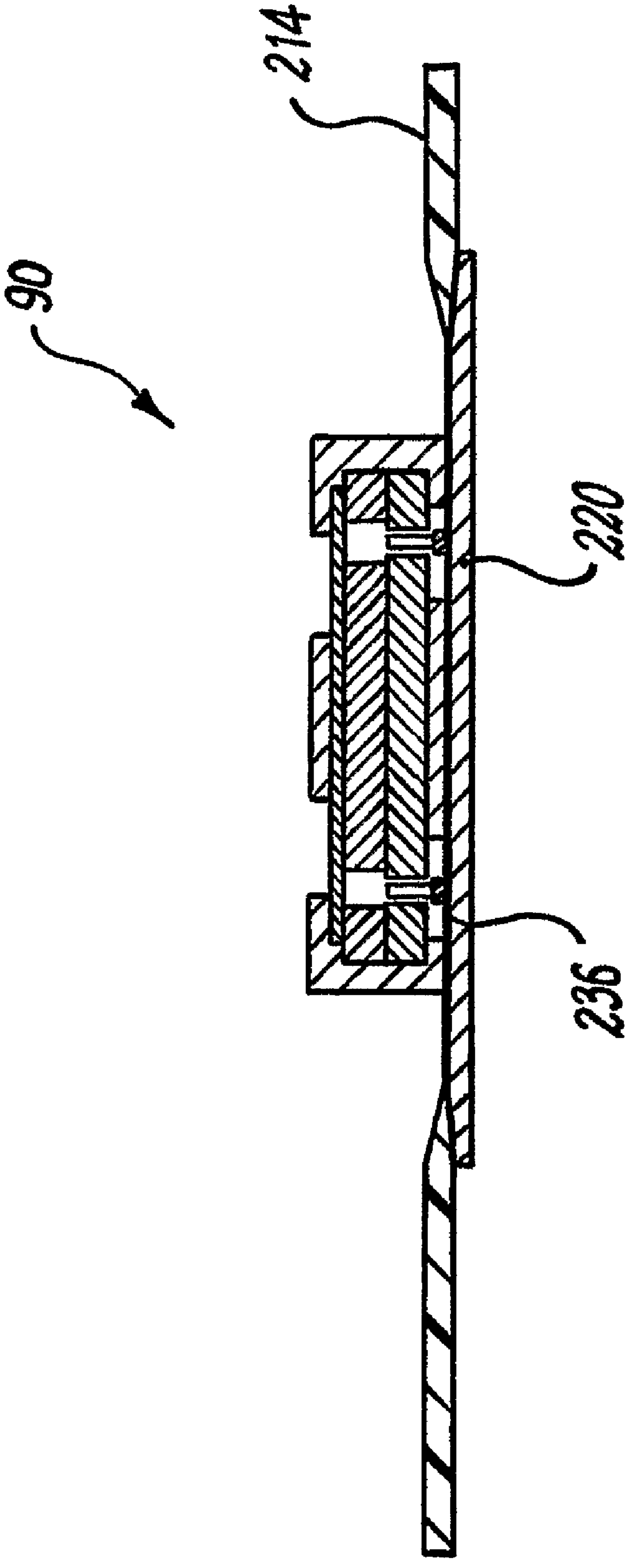
FIG. 5 is a cross-sectional view of a portion of n electronic device according to further embodiment of the invention.

FIG. 5 shows a loudspeaker assembly 90 according to an alternative embodiment. In this embodiment, the assembly is similar to that of FIGS. 3A, 3B, and 4, but differs in that the loudspeaker assembly 90 comprises a thin-walled exterior housing member 236, where the thickness of the member 236 as a whole is reduced compared with other regions of the housing 214. A hydrogel pad 220 is attached to the thin-walled exterior housing member 236 for coupling and attachment of the assembly to an auxiliary surface.

In the embodiments of FIGS. 4 and 5, provision of a formation or a thinned section in the housing 214 of the telephone improves responsiveness and freedom of movement of the exterior housing members 136, 236.

Figure 6A:
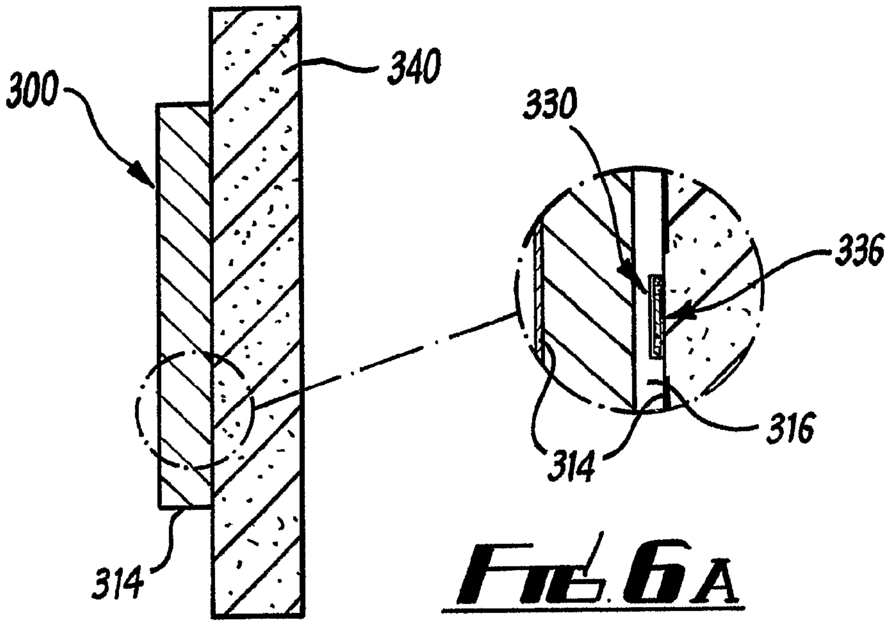
FIG. 6A is a cross-sectional view of a LCD screen with a loudspeaker assembly according to a further embodiment of the invention.

Although the above examples refer to a mobile telephone apparatus, it will be appreciated that the present invention can cover other electronic devices. An example is shown in FIGS. 6A and 6B, which generally depict a flat panel display screen at reference numeral 300.

In this example, the screen 300 comprises a screen housing 314 and a loudspeaker assembly 330 similar to the assembly 30, 130, 230 of the above described embodiments. The loudspeaker assembly 330 comprises an exterior housing member 336 that forms part of and is integral to the housing 314. The other components of the loudspeaker assembly 330 are located in a narrow cavity 316 within the housing 314.

The exterior housing member of the assembly is an integral part of the housing and this means that the loudspeaker assembly is relatively compact, protrudes less and allows it to be used in devices where there is limited available space.

Figure 6B:
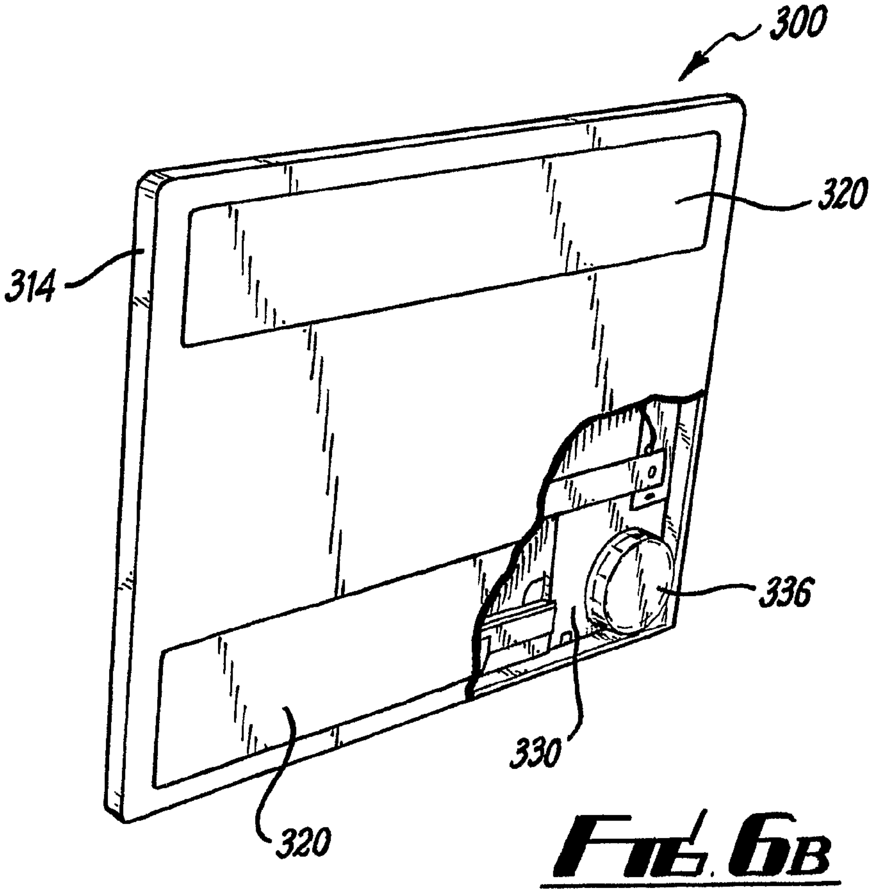
FIG. 6B is a perspective view of the LCD screen and loudspeaker assembly of FIG. 6A.

As can be seen in FIG. 6B, the screen 300 has hydrogel pads 320 applied to the outer surface of the casing. In particular the pads are applied to the housing 314 outer surface in an area opposing the loudspeaker assembly 330, i.e. to the exterior housing member 336. The pads are formed from hydrogel, and allow the screen to be attached to a wall surface 340. The hydrogel pads act as a means for acoustically coupling the loudspeaker assembly 330 to the wall surface.

The wall surface acts as a distributed mode panel-form acoustic radiator that is driven by the exterior housing member 336. The hydrogel provides an efficient transfer of vibrations from the loudspeaker assembly to the wall surface, and generates distributed modes in the wall.

The present invention may be applied in a similar manner to television displays, MP3 players or other music players, or laptop computers. The present invention might also be applied to docking stations for music players or laptop computer.

In a first mode of use, when the electronic devices of the above embodiments is not located against an auxiliary surface, the operation of the loudspeaker causes the exterior housing member 36 to emit an audible acoustic signal acceptable for normal operation. The housing member 36 functions as a component of a distributed mode loudspeaker, providing sound quality acceptable for normal operation. The housing member vibrates in a pistonic mode at frequencies in a low frequency band and in a distributed mode in frequencies in a high frequency band. In practice, the exterior housing (or components of it) will vibrate in a distributed mode at certain frequencies.

When placed on an auxiliary surface 12, the pads 20 have the effect of acoustically coupling the loudspeaker assembly 30 to the auxiliary surface 12 via the exterior member. The exterior housing member generates distributed modes in the auxiliary surface, improving the sound quality of the audio playback, particularly at low frequencies. This facilitates hands-free operation of the telephone and improved playback of audio content.

Although the above-described embodiment relate predominantly to mobile telephones, the invention is applicable to a variety of electronic devices. These include, but are not restricted to display screens, televisions, laptop computers, PDAs, games consoles, MP3 players, docking stations, and portable video devices. The invention offers particular advantages for electronic devices in which space is limited, such as portable electronic devices.

Various modifications and improvements may be made to the above-described embodiments without departing from the scope of the invention herein intended.

The invention claimed is:

1. An electronic device having an audio function, the electronic device comprising:
- an exterior housing;
- a first acoustic radiator forming part of the exterior housing;
- an acoustic transducer coupled to the first acoustic radiator; and
- coupling means attached to an exterior surface of the first acoustic radiator, the coupling means being made from an elastomeric material,
- the first acoustic radiator being configured, when the electronic device is in a first mode of use, to radiate a first sound signal into free space in dependence on an electrical audio signal received by the acoustic transducer, and
- the coupling means being configured for acoustic coupling of the first acoustic radiator to a second acoustic radiator, when the electronic device is in a second mode of use, such that the second acoustic radiator is operative to radiate a second sound signal into free space in dependence on an electrical audio signal received by the acoustic transducer,
- wherein the coupling means is shaped to prevent contact of the exterior housing with the second acoustic radiator when the coupling means is located against the second acoustic radiator when in the second mode of use.

2. The electronic device according to claim 1, in which the first acoustic radiator is configured to undergo pistonic movement.

3. The electronic device according to claim 2, in which the first acoustic radiator is configured to vibrate in a pistonic mode at frequencies in a low frequency band and to vibrate in a distributed mode at frequencies in a high frequency band.

4. The electronic device according to claim 1, in which the electronic device is configured to drive the second acoustic radiator to vibrate in a distributed mode fashion.

5. The electronic device according to claim 1, in which the elastomeric material comprises at least one of a hydrogel and a silicone.

6. The electronic device according to claim 1, in which the elastomeric material has a Shore A hardness of less than substantially 20.

7. The electronic device according to claim 1, in which the coupling means comprises at least one pad protruding from the exterior surface of the first acoustic radiator.

8. The electronic device according to claim 1, in which the exterior housing is substantially rigid.

9. The electronic device according to claim 1, in which the acoustic transducer comprises a moving coil transducer.

10. The electronic device according to claim 1, in which the exterior housing comprises a formation, which is operative to provide for pistonic movement of the first acoustic radiator.

11. The electronic device according to claim 10, in which the formation comprises a groove formed in at least one opposing surface of the exterior housing.

12. The electronic device according to claim 10, in which the first acoustic radiator is at least in part of reduced thickness compared to a thickness of the exterior housing.

13. The electronic device according to claim 1, in which the electronic device is one selected from the group consisting of: a mobile telephone; a display screen; a portable digital assistant (PDA); a computer docking station; an MP3 player; a CD player; a television; a personal computer; and a games console.

14. A method of radiating sound from an electronic device having an audio function when the electronic device is operated in one of two modes of use, the electronic device comprising an exterior housing, a first acoustic radiator forming part of the exterior housing, an acoustic transducer coupled to the first acoustic radiator, and a coupling means attached to an exterior surface of the first acoustic radiator, the coupling means being made from an elastomeric material, the method comprising:

locating the electronic device, in a first mode of use, such that a first sound signal is radiated into free space by the first acoustic radiator in dependence on an electrical audio signal received by the acoustic transducer; and locating the coupling means against a second acoustic radiator, in a second mode of use, such that the coupling means acoustically couples the first acoustic radiator to the second acoustic radiator, whereby the second acoustic radiator is operative to radiate a second sound signal into free space in dependence on an electrical audio signal received by the acoustic transducer, wherein the coupling means is shaped to prevent contact of the exterior housing with the second acoustic radiator when the coupling means is located against the second acoustic radiator when in the second mode of use.

* * * * *